United States Patent
Chang et al.

(10) Patent No.: US 11,869,831 B2
(45) Date of Patent: Jan. 9, 2024

(54) SEMICONDUCTOR PACKAGE WITH IMPROVED BOARD LEVEL RELIABILITY

(71) Applicant: MEDIATEK INC., Hsin-Chu (TW)

(72) Inventors: Chin-Chiang Chang, Hsinchu (TW); Yin-Fa Chen, Hsinchu (TW); Shih-Chin Lin, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 109 days.

(21) Appl. No.: 17/460,352

(22) Filed: Aug. 30, 2021

(65) Prior Publication Data

US 2022/0115303 A1 Apr. 14, 2022

Related U.S. Application Data

(60) Provisional application No. 63/089,064, filed on Oct. 8, 2020, provisional application No. 63/167,697, filed on Mar. 30, 2021, provisional application No. 63/185,394, filed on May 7, 2021.

(51) Int. Cl.
*H01L 23/495* (2006.01)
*H01L 23/31* (2006.01)
*H01L 23/00* (2006.01)

(52) U.S. Cl.
CPC .... *H01L 23/49541* (2013.01); *H01L 23/3107* (2013.01); *H01L 23/49503* (2013.01); *H01L 24/48* (2013.01); *H01L 2224/48175* (2013.01)

(58) Field of Classification Search
CPC ........... H01L 23/49541; H01L 23/3107; H01L 23/49503; H01L 24/48; H01L 2224/48175
USPC ......................................................... 257/670
See application file for complete search history.

(56) References Cited

U.S. PATENT DOCUMENTS

| 8,390,103 | B2 | 3/2013 | Zhao | |
| 2003/0178723 | A1* | 9/2003 | Ito | H01L 24/97 257/E23.048 |
| 2004/0124506 | A1 | 7/2004 | Ito | |
| 2005/0029640 | A1 | 2/2005 | Amano | |
| 2012/0126378 | A1 | 5/2012 | San Antonio | |
| 2016/0007464 | A1* | 1/2016 | Matsubara | H01L 23/564 361/783 |

FOREIGN PATENT DOCUMENTS

| JP | 2007-201324 A | 8/2007 |
| JP | 2018-64062 A | 4/2018 |
| TW | 201234504 A1 | 8/2012 |

* cited by examiner

*Primary Examiner* — Caleb E Henry
*Assistant Examiner* — Dilinh P Nguyen
(74) *Attorney, Agent, or Firm* — Winston Hsu

(57) ABSTRACT

A semiconductor package includes a die attach pad, a plurality of lead terminals positioned about the die attach pad and disposed along side edges of the semiconductor package, a semiconductor die mounted on the die attach pad, a molding compound encapsulating the plurality of lead terminals and the semiconductor die, and at least one dummy lead disposed in a corner region of the semiconductor package between the plurality of lead terminals.

16 Claims, 5 Drawing Sheets

SEMICONDUCTOR PACKAGE WITH IMPROVED BOARD LEVEL RELIABILITY

CROSS REFERENCE TO RELATED APPLICATIONS

This application claims priorities from U.S. provisional application No. 63/089,064 filed on Oct. 8, 2020, U.S. provisional application No. 63/167,697 filed on Mar. 30, 2021, and U.S. provisional application No. 63/185,394 filed on May 7, 2021, the disclosures of which are included in their entireties herein by reference.

BACKGROUND

The present disclosure relates generally to the field of semiconductor technology. More particularly, the present disclosure relates to a quad flat no-lead (QFN) package with improved board level reliability.

The quad flat no-lead (QFN) package is known for its small size, cost-effectiveness and good production yields. The QFN packages also possess certain mechanical advantages for high-speed circuits including improved co-planarity and heat dissipation.

Because of the slim design, handheld devices are becoming more vulnerable in case of the drop. As electronic packages are also getting thinner, drop and vibration reliability concerns become increasingly more important. Board-level drop impact testing is a useful way to characterize the drop durability of the different soldered assemblies onto the printed circuit board (PCB).

FIG. 1 is a bottom view of a conventional QFN package. As shown in FIG. 1, the conventional QFN package P has a die attach pad DP exposed from a bottom surface of the QFN package P. A plurality of lead terminals LT is arranged around the die attach pad DP. A bottom surface of each of the lead terminals LT is also exposed from the bottom surface of the QFN package P. Typically, no leads are arranged at the four corner regions CR of the QFN package P.

The failure of QFN package under the drop impact condition mainly occurs around the four corner regions CR. As the package size increases, the maximum stress at packager corners also increases. It is desired to provide an improved QFN package with improved board level drop impact performance.

SUMMARY

One object of the present invention is to provide an improved semiconductor leadframe package in order to solve the above-mentioned prior art problems or shortcomings.

One aspect of the invention provides a semiconductor package including a die attach pad, a plurality of lead terminals positioned about the die attach pad and disposed along side edges of the semiconductor package, a semiconductor die mounted on the die attach pad, a molding compound encapsulating the plurality of lead terminals and the semiconductor die, and at least one dummy lead disposed in a corner region of the semiconductor package between the plurality of lead terminals.

According to some embodiments, the plurality of lead terminals comprises a first row of lead terminals arranged along a first side edge of the semiconductor package and a second row of lead terminals arranged along a second side edge that is connected to the first side edge, wherein the at least one dummy lead is disposed in the corner region between the first row of lead terminals and the second row of lead terminals.

According to some embodiments, the semiconductor die comprises at least one input/output (I/O) pads disposed along a perimeter of the semiconductor die, and wherein the plurality of I/O pads of the semiconductor die is electrically connected to the plurality of lead terminals through bond wires.

According to some embodiments, a bottom surface of the die attach pad is exposed from the bottom surface of the semiconductor package.

According to some embodiments, the semiconductor package further includes a tie bar extending between the die attach pad and the corner region.

According to some embodiments, the at least one dummy lead is an integral part of the tie bar.

According to some embodiments, the at least one dummy lead is a distal end portion of the tie bar that is not half-etched.

According to some embodiments, the at least one dummy lead is continuously connected with rest portion of the tie bar that is half-etched.

According to some embodiments, the at least one dummy lead has an exposed surface on a bottom surface of the semiconductor package.

According to some embodiments, the exposed surface is a rectangular shaped surface.

According to some embodiments, the rectangular shaped surface has a width that is greater than a length of an exposed surface of each of the plurality of lead terminals.

According to some embodiments, the exposed surface has an L shape.

According to some embodiments, the exposed surface has a polygonal shape.

According to some embodiments, the at least one dummy lead has an exposed end surface on one of the side edges of the semiconductor package.

According to some embodiments, the at least one dummy lead does not have an exposed end surface on the side edges of the semiconductor package.

According to some embodiments, no wire bond is attached to the at least one dummy lead.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
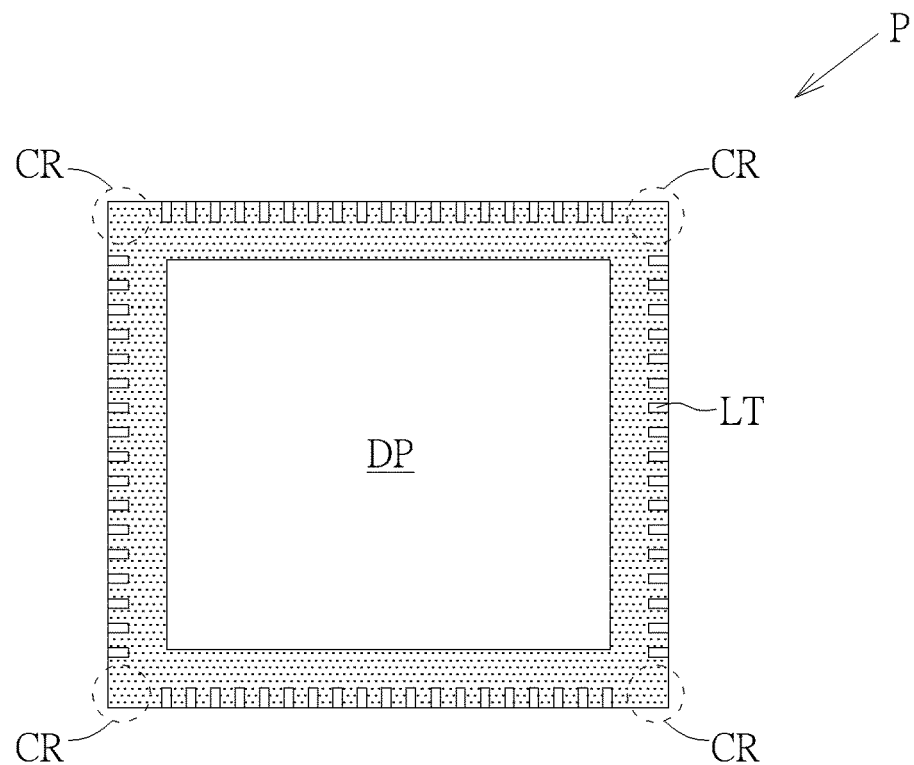
FIG. 1 is a bottom view of a conventional QFN package.

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

There are various leadframe-based surface mount components, such as quad flat no-lead (QFN) package, advanced QFN (aQFN) package, low-profile quad flat package (LQFP) or the like. A package can be attached to a printed circuit board (PCB) by, for example, soldering it to the PCB. The attachment of the packages (i.e. packaged integrated circuit) to PCBs produces printed circuit board assemblies (PCBAs), which can be used as motherboards in computers, portable devices such as mobile phone, tablets, notebooks, etc.

Generally, a leadframe strip is populated with a plurality of leadframes. A semiconductor die or microelectronic device may be mounted on each leadframe and encapsulated with a molding compound. Leadframes are separated during singulation of the strip to create individual semiconductor packages. One type of the semiconductor packages is a flat-pack no-lead package where each terminal is exposed at a bottom and at a side of the package. Typically, the sawing process during singulation of the strip typically results in lead terminals that have at least some exposed base metal on a cut end, or flank, of each lead terminal. Typically, the aforesaid cut end is vertically flush with a sidewall surface of the package or the sidewall surface of a molding compound.

The term of quad flat no-lead or small outline no-lead package indicates that the leads do not have cantilevered leads, but flat leads, which are typically arrayed along the periphery of the packaged device. The metal of the leads may be connected by solder material to the metal of respective contact pads of an external part. QFN packages typically use a copper leadframe for the die assembly and PCB interconnection.

The invention is shown embodied in a quad flat no-lead (QFN) type package. However, those of ordinary skill in the art will readily understand the details of the invention and that the invention is applicable to other package types.

Figure 2:
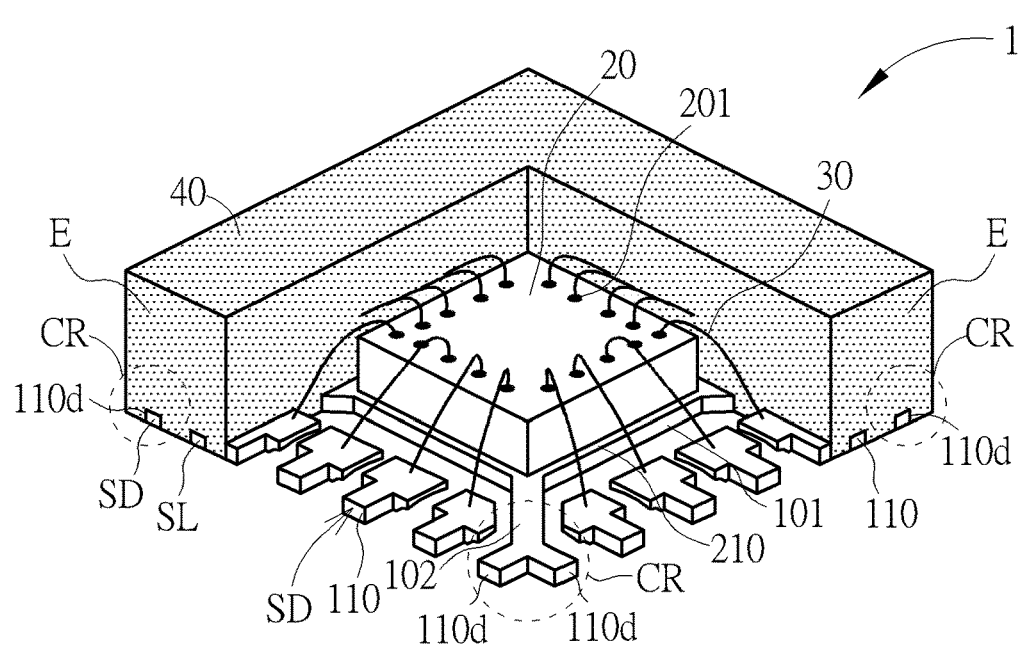
FIG. 2 is an isometric cut away view of a quad flat no-lead (QFN) package, with part of a molding compound removed, according to an embodiment of the invention.
Figure 3:
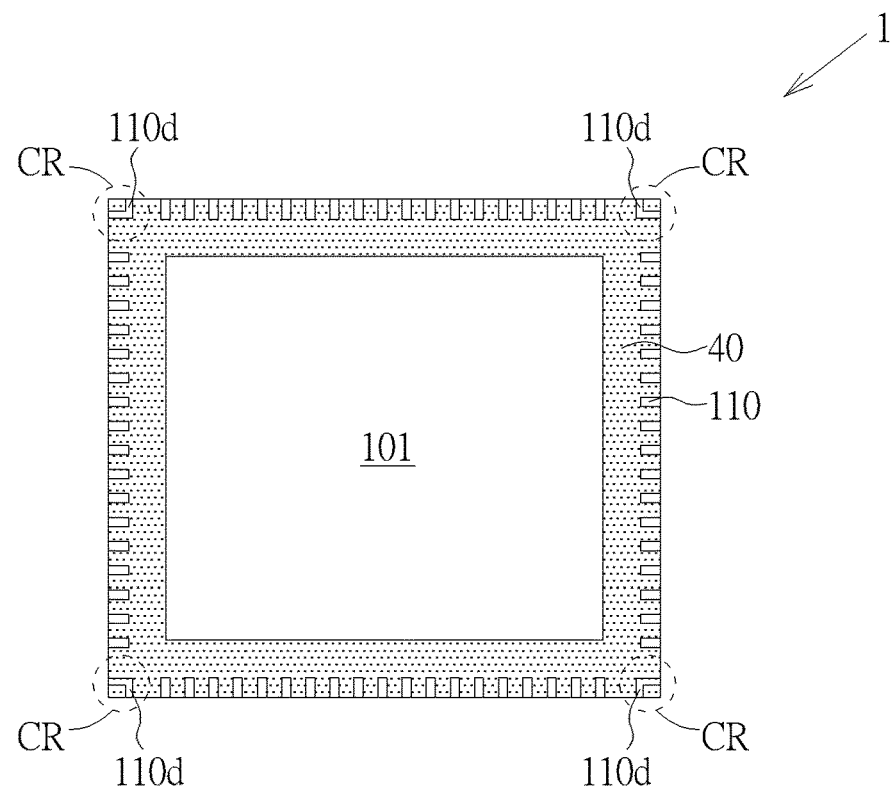
FIG. 3 is a bottom view of the QFN package in FIG. 2.

FIG. 2 is an isometric cut away view showing an exemplary saw-type QFN package according to an embodiment of the present invention. As shown in FIG. 2, the QFN package 1 comprises a leadframe 10 having a die attach pad (or die paddle) 101 and a plurality of lead terminals (or input/output leads; hereinafter also referred to as I/O leads) 110 arranged around the die attach pad 101 at a prescribed spacing and pitch. A semiconductor chip or die 20 is mounted on the die attach pad 101 that is supported at a central region of the QFN package 1 through four tie bars 102 extending at four corners of the QFN package 1. One end of each of the four tie bars 102 terminates at the die attach pad 101 and the other end of the each of the four tie bars 102 terminates at the edge of the leadframe 10. In FIG. 3, for example, the QFN package 1 comprises four fishtail tie bars 102 extending from four corners of the die attach pad 101 to corresponding four corner regions CR of the QFN package 1.

The die attach pad 101 of the QFN package 1 may be exposed from the bottom of the package thereby providing better heat dissipation. The die attach pad 101 and lead terminals 110 may be formed of any suitable material such as copper, aluminum, alloy or any other suitable conductive material for leadframes as understood by those of ordinary skill in the art. The lead terminals 110 may be positioned about the die attach pad 101 in a grid array pattern, outwardly of semiconductor die 20 and adjacent the lateral periphery of the QFN package 1.

It is to be understood that the number of lead terminals 110 and dimension of the QFN package 1 depicted in the figures are for illustration purposes only. It is to be understood that the lead terminals 110 for transmitting signals from or to the semiconductor die 20 may be arranged in single row, dual rows or triple rows depending upon various design requirements. While it is desirable to have the lead terminals 110 positioned about each side of the QFN package 1 so as to maximize the number of pin counts in the package, some designs may not require such an arrangement. In some embodiments, optionally, a ground ring (not shown) may be disposed between the plurality of lead terminals 110 and the die attach pad 101.

According to an embodiment, for example, the die 20 may be adhered to the die attach pad 101 through an adhesive film 210. According to an embodiment, a plurality of input/output (I/O) pads 201 is disposed along a perimeter of an active surface of the die 20. According to an embodiment, each of the lead terminals 110 is electrically connected to an I/O pad 201 on the active surface of semiconductor die 20 through a bond wire 30 such as a copper wire or gold wire, but not limited thereto. In some embodiments, the at least one semiconductor die 10 may be installed within the package in a flip-chip manner.

According to an embodiment, the semiconductor die 20 and the bond wires 30 are encapsulated with a molding compound 40, which also partially encapsulates the lead terminals 110 and extends between die attach pad 101 and the lead terminals 110. According to an embodiment, the molding compound 40 may comprise silicon particle-filled polymer material applied under heat and pressure by transfer molding, as well known in the art.

According to an embodiment, each of the plurality of lead terminals 110 has an exposed outer end SL, or flank presented on the side edge E of the QFN package 1. According to an embodiment, each row of the lead terminals 110 on the side edge E of the QFN package 1 may be sandwiched by a pair of dummy leads 110d, which are disposed within the corner regions CR of the QFN package 1. According to an embodiment, no wire bonds are formed on the dummy leads 110d.

Typically, an entire lower surface of each of four tie bars of a conventional QFN package is subjected to a half-etching process such that the thickness of each tie bar is less than the thickness of the lead frame. It means that the tie bars are normally not exposed from the bottom of the conventional QFN package. It is noted that the "half-etching" herein does not mean only exactly removing a half of the thickness of the metal leadframe through etching but also includes a partial etching for removing merely a part of the thickness of the metal leadframe.

According to an embodiment, each of the dummy leads 110d is an integral, monolithic part of the tie bar 102. In FIG. 2, each of the dummy leads 110d is a distal end portion of the tie bar 102 that is not half-etched. The rest portion of each tie bar 102 is half-etched. According to an embodiment, the dummy lead 110d is continuously connected with the half-etched portion of the tie bar 102.

FIG. 3 is an exemplary bottom view of the QFN package 1 according to an embodiment of the invention. For example, the QFN package 1 may have a package size of 9 mm×9 mm and a total number of 76 I/O leads or pins. As shown in FIG. 3, each of the lead terminals 110 has an exposed surface on the bottom surface of the QFN package 1 for subsequent electrical coupling with another electrical component such as a printed circuit board (not shown). The two dummy leads 110d disposed in each corner region CR present an L-shaped, exposed bottom surface on the bottom surface of the QFN package 1. The two dummy leads 110d disposed in each corner region CR reinforce the corner regions CR of the QFN package 1, thereby improving the board level drop impact performance and reliability.

Figure 4:
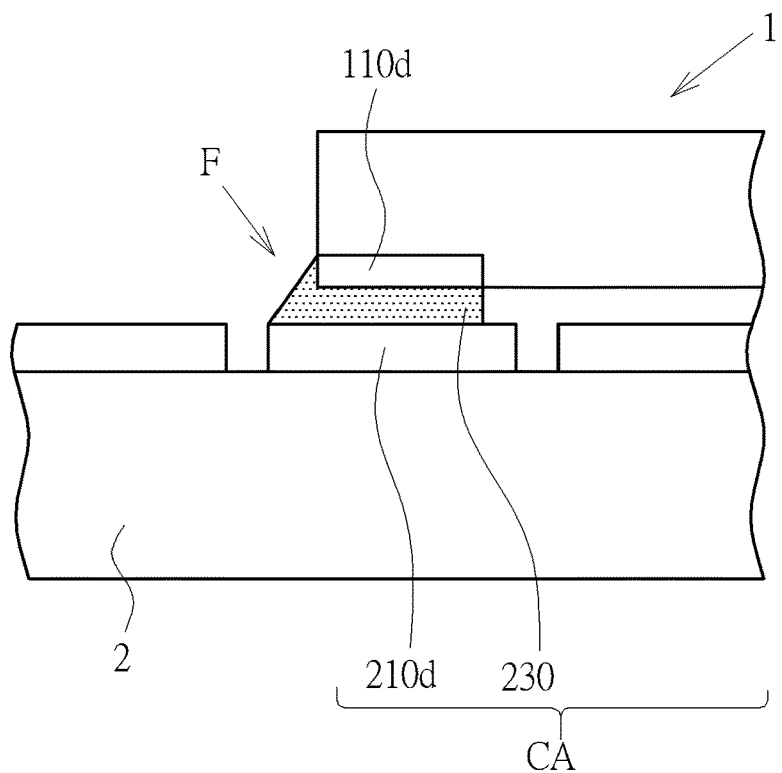
FIG. 4 is a schematic, partial sectional view of a PCB assembly showing a solder joint structure between a dummy lead and a dummy land pad according to an embodiment of the invention.

FIG. 4 is a schematic, partial sectional view of an assembly showing a solder joint structure after the QFN package is mounted on a PCB. As shown in FIG. 4, when mounting the QFN package 1 on a PCB 2, a corresponding dummy land pad 210d may be provided within a chip mounting area CA of the PCB 2. A solder joint 230 may be formed between the dummy leads 110d and the dummy land pad 210d. To solder QFN package 1 to the PCB 2, solder paste can be applied to the surface of the land pads within the defined regions. The solder paste can be applied onto the PCB by stencil printing methods, but not limited thereto.

After the application of solder paste, the QFN package 1 can be positioned on the PCB 2, and the PCB assembly can be placed into an oven and heated. The heating causes the solder to melt, leading to wetting and wicking. According to an embodiment, a solder fillet F may be formed on the exposed outer end of each dummy lead 110d on the side edge of the QFN package 1. The solder fillet F further improves the joint strength of the lead terminals around the corner regions.

Figure 5:
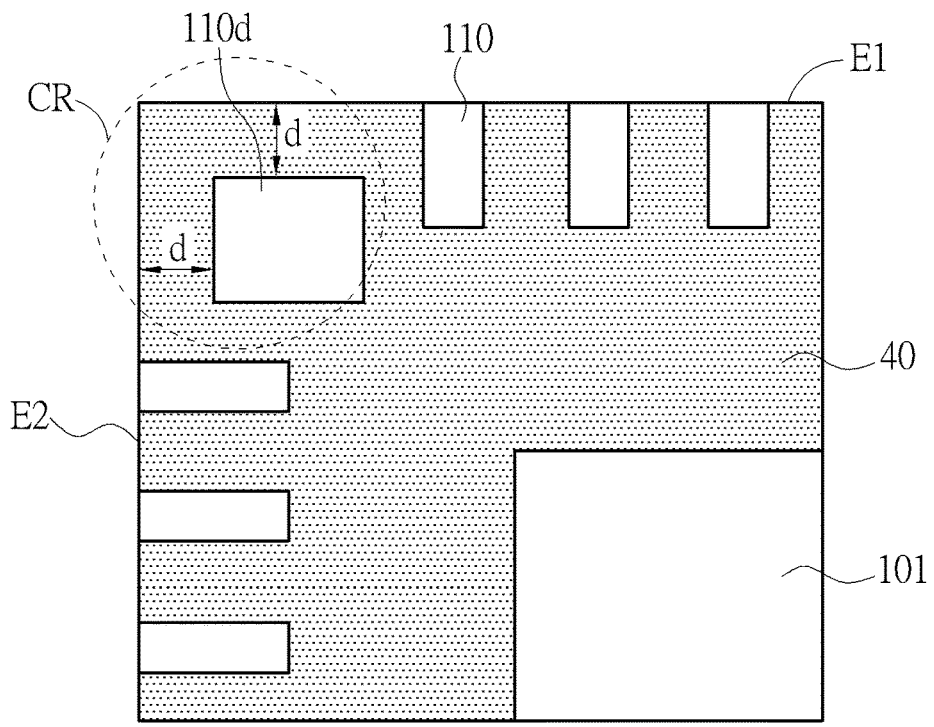
FIG. 5 to FIG. 10 are partial bottom views of the QFN package showing various patterns of the exposed surface of the dummy lead disposed in the corner region of the QFN package.
Figure 6:
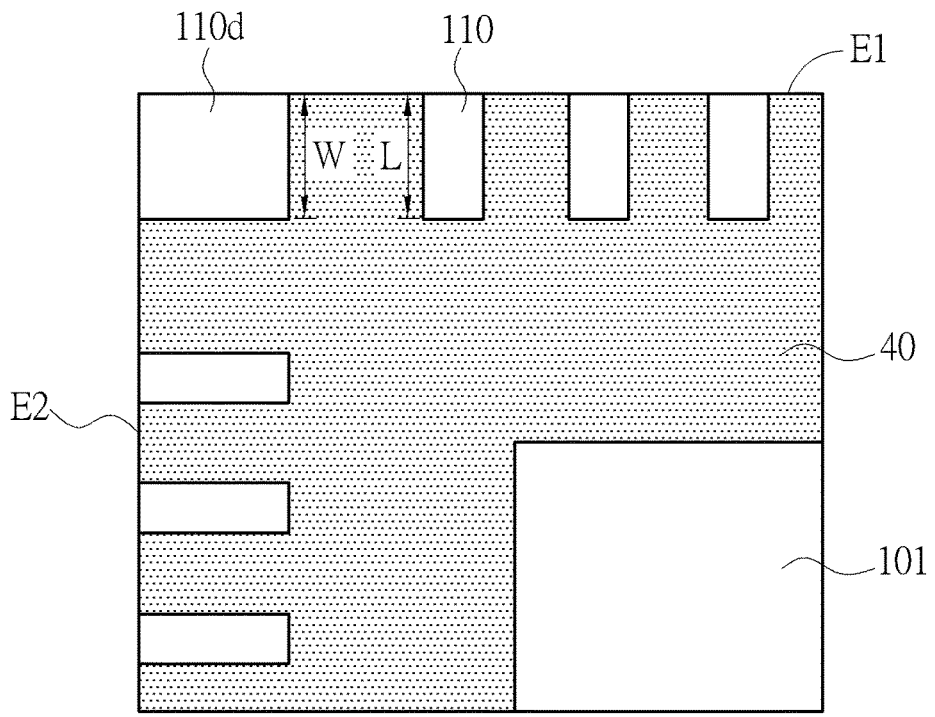
Figure 7:
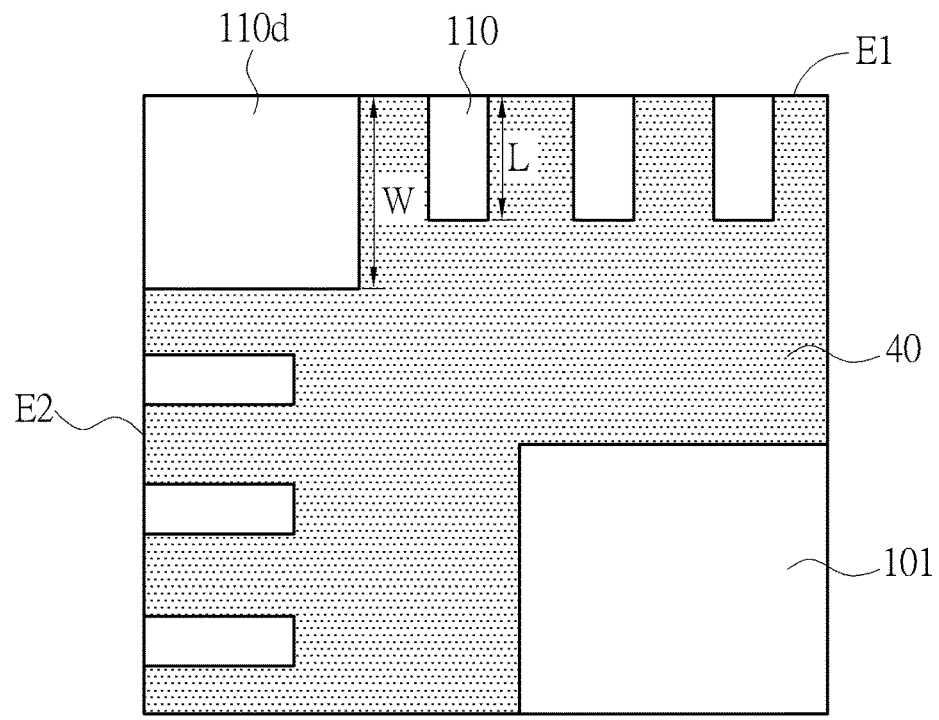
Figure 8:
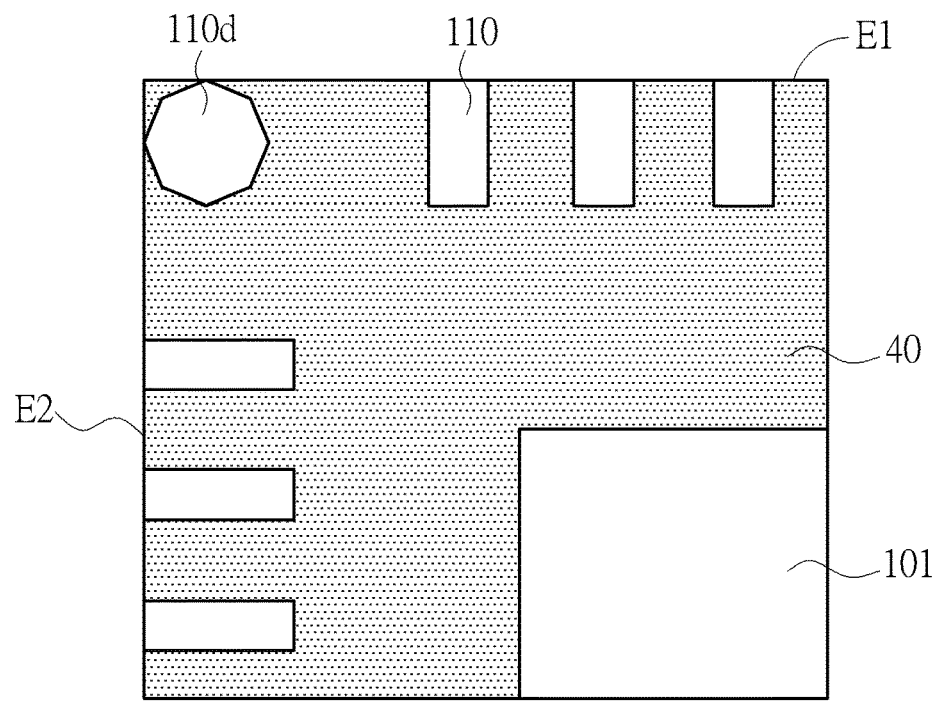
Figure 9:
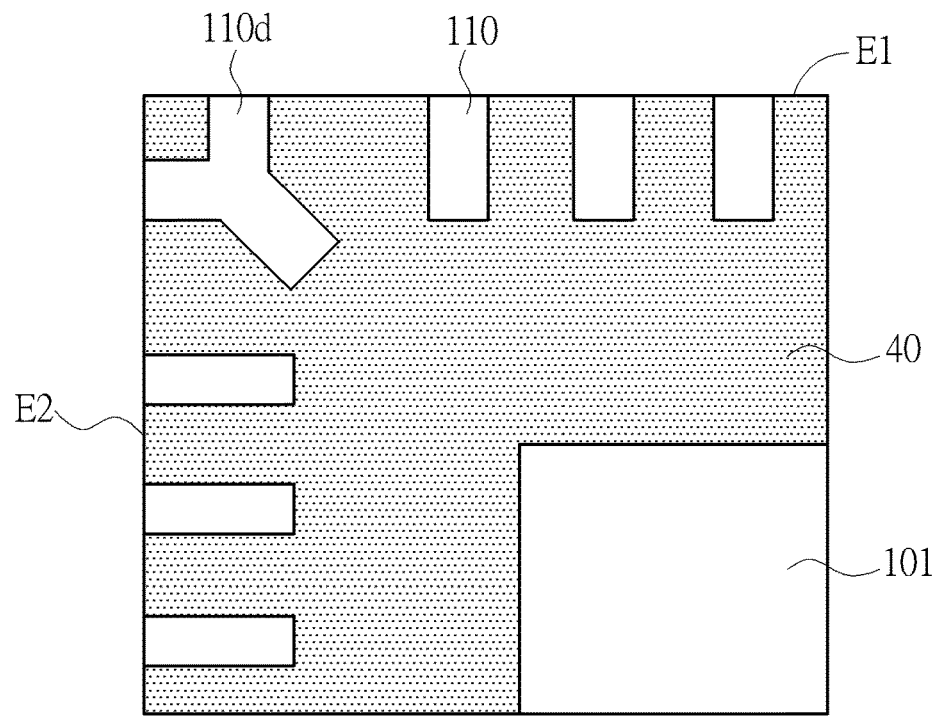
Figure 10:
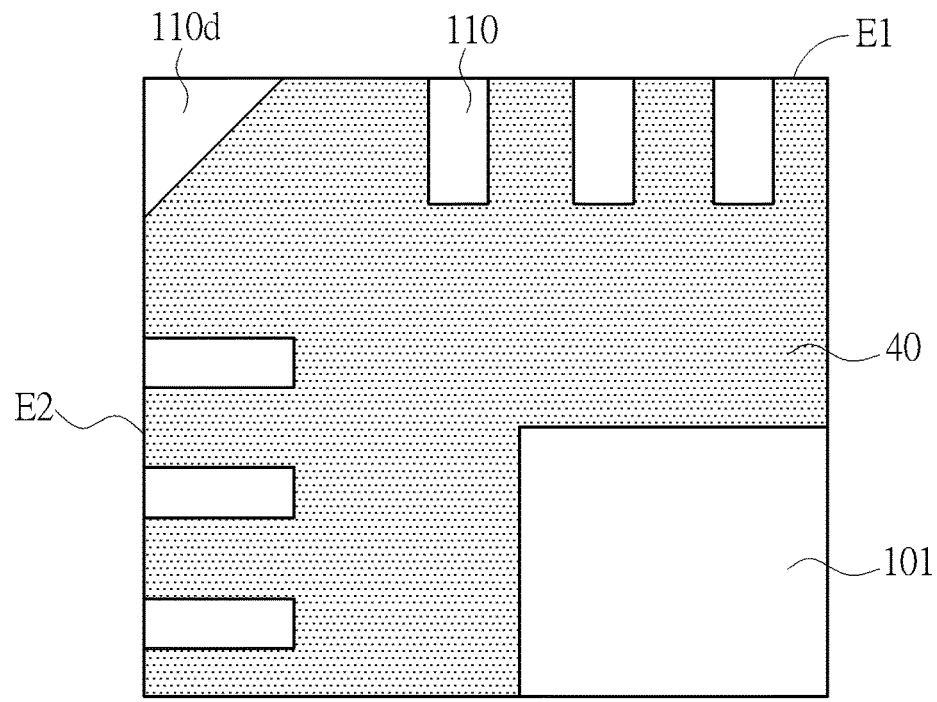

FIG. 5 to FIG. 10 are partial bottom views of the QFN package showing various patterns or shapes of the exposed surface of the dummy lead disposed in the corner region of the QFN package. In FIG. 5, the dummy lead (or dummy pad) 110d disposed in the corner region CR is kept a predetermined distance d away from the adjacent two side edges E1 and E2 of the QFN package 1, and therefore does not have an exposed end surface on any of the two adjacent side edges E1 and E2. The bottom surface of the dummy lead 110d, which is exposed from the bottom of the QFN package 1, may have a rectangular or square shape. In some embodiments, the bottom surface of the dummy lead 110d exposed from the bottom of the QFN package 1 may have a round shape, an oval shape or any other suitable shapes. The dummy lead 110d may be a portion of the tie bar 102 that is not half-etched. In FIG. 6, the rectangular-shaped dummy lead 110d has two end surfaces exposed from the adjacent two side edges E1 and E2, respectively. The exposed, rectangular-shaped bottom surface of the dummy lead 110d may have a width W that is smaller than or equal to a length L of the lead terminals 110. In FIG. 7, likewise, the rectangular-shaped dummy lead 110d has two end surfaces exposed from the adjacent two side edges E1 and E2, respectively. The exposed, rectangular-shaped bottom surface of the dummy lead 110d may have a width W that is greater than a length L of the lead terminals 110. In FIG. 8, the exposed bottom surface of the dummy lead 110d may have a polygonal shape such as octagonal shape with its two vertexes touching the adjacent two side edges E1 and E2, respectively. In FIG. 9, the exposed bottom surface of the dummy lead 110d has a Y shape or fishtail shape and the dummy lead 110d has two end surfaces exposed from the adjacent two side edges E1 and E2, respectively. In FIG. 10, the exposed bottom surface of the dummy lead 110d has a triangular shape, for example, an isosceles right triangle shape. Likewise, the dummy lead 110d has two end surfaces exposed from the adjacent two side edges E1 and E2, respectively.

It is advantageous to use the present invention because the dummy leads or pads disposed in the four corner regions of the QFN package can effectively improve the board level drop impact performance and reliability by shifting the maximum stress from the adjacent I/O lead or pin to the dummy lead or pad itself. According to the experimental results, the rectangular-shaped dummy lead with a larger surface area as depicted in FIG. 7 has better performance (lower stress ratio) than other dummy lead patterns. The drop impact performance of the rectangular-shaped dummy lead depicted in FIG. 6 is better than that of the L-shaped dummy lead depicted in FIG. 3 and the Y-shaped dummy lead depicted in FIG. 9. The drop impact performance of the L-shaped dummy lead depicted in FIG. 3 is better than that of the triangular-shaped dummy lead depicted in FIG. 10 and the inwardly withdrawn dummy lead or pad depicted in FIG. 5.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor package, comprising:
a die attach pad;
a plurality of lead terminals positioned about the die attach pad and disposed along side edges of the semiconductor package;
a semiconductor die mounted on the die attach pad;
a molding compound encapsulating the plurality of lead terminals and the semiconductor die; and
at least one dummy lead disposed in a corner region of the semiconductor package between the plurality of lead terminals, wherein the at least one dummy lead disposed in the corner region is kept a predetermined distance away from adjacent two side edges of the semiconductor package, and therefore does not have an exposed end surface on any of the adjacent two side edges.

2. The semiconductor package according to claim 1, wherein the plurality of lead terminals comprises a first row of lead terminals arranged along a first side edge of the semiconductor package and a second row of lead terminals arranged along a second side edge that is connected to the first side edge, wherein the at least one dummy lead is disposed in the corner region between the first row of lead terminals and the second row of lead terminals.

3. The semiconductor package according to claim 1, wherein the semiconductor die comprises at least one input/output (I/O) pads disposed along a perimeter of the semiconductor die, and wherein the plurality of I/O pads of the semiconductor die is electrically connected to the plurality of lead terminals through bond wires.

4. The semiconductor package according to claim 1, wherein a bottom surface of the die attach pad is exposed from the bottom surface of the semiconductor package.

5. The semiconductor package according to claim 1 further comprising:
a tie bar extending between the die attach pad and the corner region.

6. The semiconductor package according to claim 5, wherein the at least one dummy lead is an integral part of the tie bar.

7. The semiconductor package according to claim 5, wherein the at least one dummy lead is a distal end portion of the tie bar that is not half-etched.

8. The semiconductor package according to claim 7, wherein the at least one dummy lead is continuously connected with rest portion of the tie bar that is half-etched.

9. The semiconductor package according to claim 1, wherein the at least one dummy lead has an exposed surface on a bottom surface of the semiconductor package.

10. The semiconductor package according to claim 9, wherein the exposed surface is a rectangular shaped surface.

11. The semiconductor package according to claim 10, wherein the rectangular shaped surface has a width that is greater than a length of an exposed surface of each of the plurality of lead terminals.

12. The semiconductor package according to claim 9, wherein the exposed surface has an L shape.

13. The semiconductor package according to claim 9, wherein the exposed surface has a polygonal shape.

14. The semiconductor package according to claim 9, wherein the exposed surface has a Y shape or a fishtail shape.

15. The semiconductor package according to claim 9, wherein the exposed surface has a triangular shape.

16. The semiconductor package according to claim 1, wherein no wire bond is attached to the at least one dummy lead.

* * * * *